United States Patent [19]
Chan et al.

[11] Patent Number: 5,792,672
[45] Date of Patent: Aug. 11, 1998

[54] PHOTORESIST STRIP METHOD

[75] Inventors: Lap Chan; Simon Chooi Yen Meng; Tony Chan, all of Singapore, Singapore

[73] Assignee: Chartered Semiconductor Manufacturing Ltd., Singapore, Singapore

[21] Appl. No.: 618,891

[22] Filed: Mar. 20, 1996

[51] Int. Cl.[6] .................................................. H01L 21/465
[52] U.S. Cl. ............................ 438/6; 438/622; 437/228
[58] Field of Search ...................... 438/6, 622; 437/228

[56] References Cited
U.S. PATENT DOCUMENTS 4,732,658  3/1988  Lee ............................................. 437/228

Primary Examiner—Douglas W. Robinson
Assistant Examiner—Everett White
Attorney, Agent, or Firm—George O. Saile; Stephen B. Ackerman

[57] ABSTRACT

An improved method for removing a photoresist mask from an etched aluminum pattern after etching the pattern in a chlorine containing plasma has been created. The method is a two step process, in which a first stripping step is in a plasma containing $O_2$ and $H_2O$ and a second stripping step is in a plasma containing $O_2$.

42 Claims, 3 Drawing Sheets

FIG. 1 - Prior Art

PHOTORESIST STRIP METHOD

BACKGROUND OF THE INVENTION

(1) Field of the Invention

This invention relates to the fabrication of semiconductor components, and more particularly to the formation of conducting patterns by dry etching methods. More specifically, the invention is directed to an improved method of post-metal etch stripping of a photoresist mask and removal of residual corrosion inducing components.

(2) Description of Related Art

In the fabrication of semiconductor integrated circuits, metal conductor lines are used to interconnect the many components in device circuits. Due to shrinkage in size of semiconductor components and increased circuit density, the complexity of interconnecting the many components in the dense circuits requires that the fabrication processes used to define the metal interconnect patterns provide precise dimensional control. Advances in lithography and masking techniques and dry etching processes, such as RIE (Reactive Ion Etching) and other plasma etching processes, allow production of sub-micron width conducting patterns with spacings also in the sub-micron range. In general, as illustrated in FIG. 1, the process steps used to pattern metal conductor patterns comprise: Step 10, deposition of a conducting layer; Step 11, formation, by standard lithographic techniques, of a photoresist mask or other mask, such as titanium oxide or silicon oxide, in the form of the desired metal interconnection pattern; Step 12, loading substrate to etch tool; Step 13, dry etching to remove the conducting layer from the areas not covered by the mask, leaving the metal layer in the form of the masked pattern; Step 14, transferring the substrate to a photoresist strip chamber; Step 15, removing the mask layer, exposing the top surface of the metal layer; and then, Step 16, unloading the substrate from the etch tool.

Challenges in the industry are to provide metal conductor dry etching processes which have low cost, improved throughput and manufacturing yield and efficiency, and which can be utilized in state-of-the-art semiconductor manufacturing equipment. State-of-the-art semiconductor manufacturing equipment includes single wafer RIE or plasma etch tools for etching metal conductor patterns, such as aluminum or aluminum-silicon-copper alloys. An example of this type of tool is the LAM Research TCP9600 single wafer metal etcher. Attached downstream to this metal etcher is a chamber for stripping a photoresist mask. The equipment is configured so that upon completion of the metal etch process the wafer substrate is transferred into the photoresist stripper chamber, commonly called the DSQ (DownStream Quartz) asher/stripper. Maximum efficiency for such an in-line tool configuration is obtained when processes are simultaneously performed in both chambers and when the process times for each chamber are approximately equal, so that one of the chambers does not stand idle while awaiting completion of the process in the other chamber. For example, the process used to etch a metal layer pattern in the metal etch chamber should require a time approximately equal to the time required to strip the photoresist mask from the etched pattern in the downstream photoresist strip chamber.

As is well known in the industry, dry etching processes for metal layers composed of aluminum or aluminum alloys use chlorine and chlorine compounds as the reactive components in the etchant gas. During the etching process the chlorine and chlorine compounds, as well as chlorine bearing reaction products become embedded in and/or attached to the masked pattern sidewalls and other surfaces on the wafer substrate. For example, chlorine and chlorine compounds and chlorine bearing reaction products become embedded into the photoresist mask on top of the etched metal pattern and attached to the sidewalls of the etched pattern. If the chlorine, chlorine compounds, and chlorine bearing reaction products are not removed or passivated before the wafer is exposed to the atmosphere of the manufacturing plant, then the residual chlorine causes corrosion and attack of the etched metal pattern. This corrosion is unacceptable, thereby reducing the yield of the metal etch process. Additionally, if the corrosion is not immediately detected, it will show up later as a device failure or as a contributing factor in a reliability failure mechanism. Therefore, it is important that following the metal etch process the residual chlorine, chlorine compounds, and chlorine bearing etch products be removed from all surfaces of the wafer substrate and sidewalls of the etched metal pattern. The challenge in the industry is to provide post-metal etch processes which efficiently strip the photoresist mask and remove residual chlorine, chlorine compounds, and chlorine bearing etch byproducts without compromising the throughput of in-line processing tools.

It is a well known fact that $O_2$ can be used to remove or etch photoresist, as shown in U.S. Pat. No. 4,732,658 entitled "Planarization of Silicon Semiconductor Devices" granted Mar. 22, 1988 to Eddie C. Lee, which describes RIE of photoresist in $CHF_3$ and $O_2$, wherein the ratio of constituents is varied in order to equalize the etch rates of photoresist and silicon oxide. However, this patent does not address the details of a process applicable to in-line processing tools, which would accomplish both photoresist stripping and removal of chlorine following dry etching of an aluminum interconnection pattern.

The present invention is directed to a novel method of removing a photoresist mask from an etched aluminum interconnection pattern subsequent to etching the pattern in a chlorine containing plasma.

SUMMARY OF THE INVENTION

One object of the present invention is to provide an improved and new process for removing a photoresist mask from an etched aluminum pattern after etching the pattern in a chlorine containing plasma.

Another object of the present invention is to provide a new and improved process for removing residual chlorine containing fragments from the surfaces and sidewalls of an etched aluminum pattern after etching the pattern in a chlorine containing plasma.

Another object of the present invention is to provide a new and improved method of post-metal etch stripping of a photoresist mask and removal of residual corrosion inducing components, wherein the method is applicable to in-line sequential processing tools.

A further object of the present invention is to provide a new and improved method of post-metal etch stripping of a photoresist mask and removal of residual corrosion inducing components, wherein the method enhances the metal etch process yield, tool efficiency and reliability, and tool throughput, thereby reducing the cost of manufacture of semiconductor devices.

The method in accordance with the invention comprises, after etching a conducting material layer by vertical anisotropic etching, transferring the substrate containing the etched pattern of conducting material to a second heated chamber and performing the improved photoresist stripping method, in which a first stripping step is in a plasma containing $O_2$ and $H_2O$ and a second stripping step is in a plasma containing $O_2$.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved process for removing a photoresist mask from an etched aluminum pattern after etching the pattern in a chlorine containing plasma will now be described in detail. The method can be used for stripping a photoresist mask from an etched pattern in an aluminum layer or an aluminum alloy layer such as aluminum-copper-silicon, where copper is between about 0.2 to 2.0% and silicon is between about 0 to 1.0%. The method can, also, be used to strip a photoresist mask from an etched pattern in a multilayered conducting structure, which contains an aluminum, aluminum-copper or aluminum-copper-silicon layer and adhesion, barrier and ARC (Anti-Reflection-Coating) layers. Examples of such conducting layers commonly used in the industry are: Ti/TiW/Al-Cu-Si/TiN, Ti/TiN/Al-Cu-Si/TiN, Ti/TiN/Al-Cu/TiN, Ti/Al-Cu/TiN, and Ti/Al-Cu-Si/TiN. In such multilayered conducting structures Ti is used to provide a low resistance contact to a doped silicon region through the formation of titanium silicide and to provide adhesion to insulating layers; TiW or TiN is used as a barrier layer to prevent penetration of Al into a shallow silicon junction; Al-Cu-Si or Al-Cu is the primary conducting layer and Ti, Ti/TiW, or Ti/TiN under the Al-Cu-Si or Al-Cu layer serves as an adhesion layer; TiN on top of all the structures serves as an ARC (Anti-Reflection-Coating) layer to facilitate formation of the mask pattern in photoresist by photolithography. Only the specific areas unique to understanding this invention will be described in detail.

Figure 1:
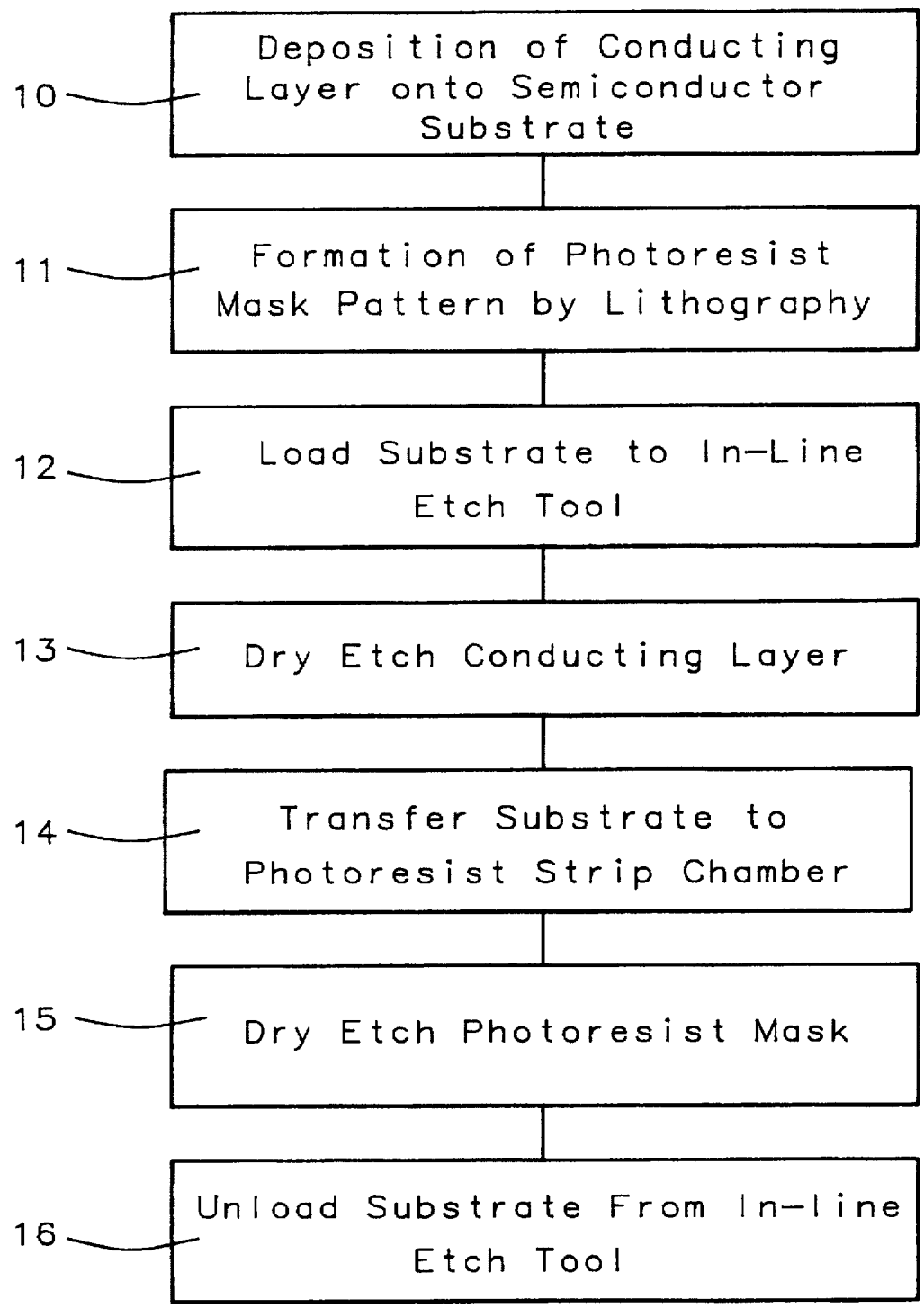
FIG. 1, which is a flow chart for the method of etching a conducting layer to form an interconnection pattern on a semiconductor substrate, using an in-line single wafer processing tool.

As shown in FIG. 1, in state-of-the-art manufacturing processes for formation of conducting interconnection patterns on semiconductor substrates it is customary, when utilizing in-line single wafer processing equipment, to etch the photoresist masked conducting layer in a first chamber and then transfer the wafer to a second chamber, where the photoresist mask is removed. For efficient operation and throughput in such in-line equipment, processes are simultaneously performed in both chambers. Also, maximum efficiency and throughput are obtained when the process times for each chamber are appoximately equal, so that one of the chambers does not stand idle while awaiting completion of the process in the other chamber. Therefore, the process time required to strip the photoresist mask, Step 15, should be approximately equal to the process time to etch the conducting layer, Step 13.

When using a LAM Research TCP9600 in-line single wafer metal etch tool with an in-line DSQ (DownStream Quartz) asher/stripper, one recipe for stripping the photoresist mask, Step 15, is: 900 mTorr total pressure, 1200 Watts RF power, 250 sccm $O_2$ flow rate, 250 sccm $H_2O$ flow rate, and 140 sec. process time. This recipe suffers from several deficiencies, including incomplete removal of the photoresist mask in the time allotted for the process. While a solution to this problem could be to perform the stripping process at a higher RF power level, this is a costly solution. It is highly desirable to effect a process which does not require use of a higher RF power level; and, in fact, a stripping process which requires a lower RF power level has been invented and will be described now in detail.

Results of experimental studies of the controllable parameters of total pressure, RF power, $O_2$ flow rate, $H_2O$ flow rate, and process time have allowed prescription of a two-step photoresist removal process which is effective at a lower RF power. These experimental studies involved the measurement of photoresist etch rates as a function of the above parameters. Results are shown in Table 1.

TABLE 1

| RF Power Watts | Pressure mTorr | $O_2$ Flow sccm | $H_2O$ Flow sccm | Etch Rate Å/min |
|---|---|---|---|---|
| 1200 | 900 | — | 250 | 4130 |
| 1200 | 1200 | — | 250 | 4642 |
| 1200 | 1200 | — | 400 | 3959 |
| 1200 | 900 | 250 | — | 10069 |
| 1200 | 1200 | 250 | — | 12159 |
| 1200 | 1200 | 600 | — | 19934 |
| 1200 | 1200 | 800 | — | 12124 |
| 1200 | 900 | 60 | 250 | 4160 |
| 1200 | 900 | 250 | 250 | 4436 |
| 1200 | 1200 | 250 | 250 | 6387 |
| 1200 | 1200 | 600 | 250 | 5452 |
| 1000 | 1200 | 550 | — | 13040 |
| 1000 | 1200 | 600 | — | 18130 |
| 1000 | 1200 | 650 | — | 13990 |
| 1000 | 1200 | 900 | — | 16594 |
| 1000 | 1100 | 600 | — | 13394 |
| 1000 | 1200 | 600 | — | 18130 |
| 1000 | 1350 | 600 | — | 13290 |
| 1000 | 1500 | 600 | — | 12782 |
| 1000 | 2000 | 600 | — | 12442 |
| 1000 | 3000 | 600 | — | 7156 |
| 1000 | 1200 | 250 | 250 | 4004 |
| 1000 | 1200 | 600 | — | 15184 |

The following conclusions may be drawn from the experimental results: 1.) An $O_2$ plasma etches the much faster than the combination of $O_2$ and $H_2O$ plasmas; 2.) Among the different $O_2$ flow rates, the 600 sccm flow rate of $O_2$ produces the most dramatic photoresist etch rate: about 20,000 Å/min. at 1200 Watts RF power and between 15,000 and 18,000 Å/min. at 1000 Watts RF power; 3.) There is not a strong dependence of photoresist etch rate on pressure in the range between 900 to 2000 mTorr.

Additional studies have shown that the presence of $H_2O$ in the photoresist etching plasma causes the removal of chlorine and chlorine compounds and chlorine bearing reaction products, which are embedded into the photoresist mask on top of the etched metal pattern and attached to the sidewalls of the etched pattern, following the aluminum etch process.

Figure 2:
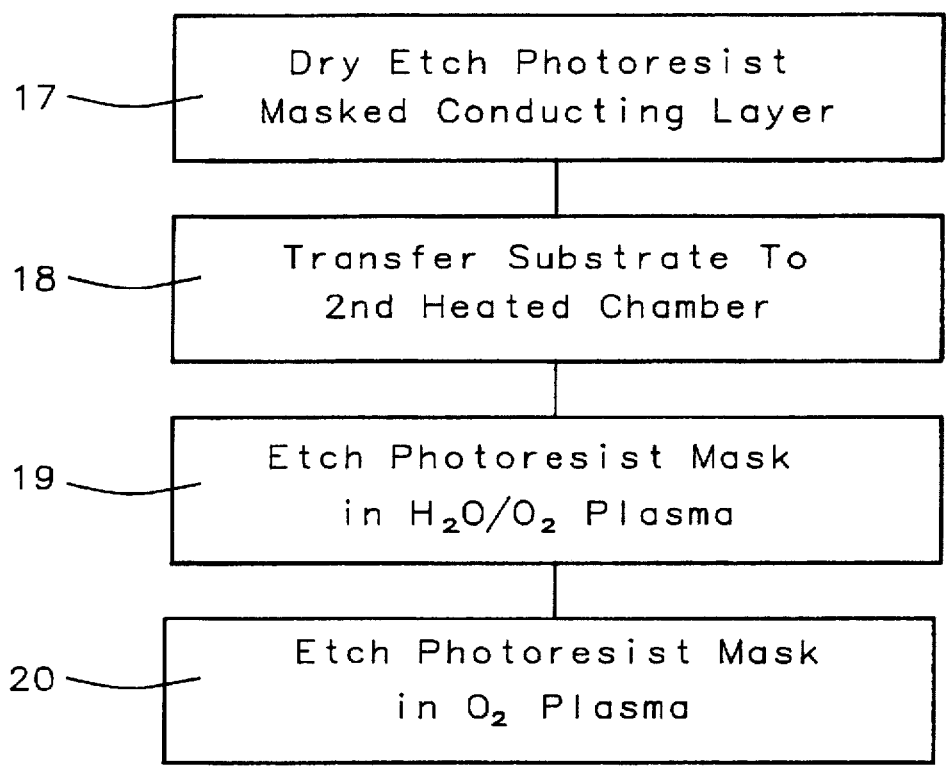
FIG. 2, which is a flow chart of the method of the present invention.

Now referring to FIG. 2, the basic steps, steps 17, 18, 19, and 20, in the process of method of the present invention are summarized. These steps will be described below in conjunction with FIGS. 3–5.

Figure 3:
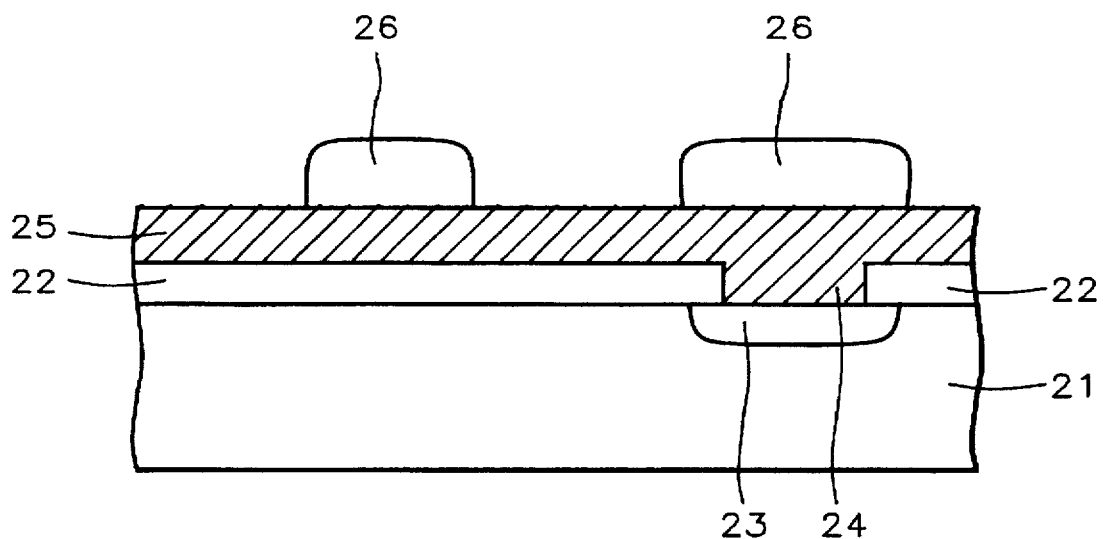
FIG. 3, which schematically, in cross-sectional representation, illustrates a photoresist masked conducting layer on a semiconductor substrate, prior to etching the conducting layer.

FIG. 3, schematically in cross-sectional representation, depicts a portion of a semiconductor device. The substrate, 21, is conventionally a monocrystalline semiconductor substrate provided with an overlying dielectric layer, 22. At least one contact opening, 24, is formed in the dielectric layer, 22, for making contact to a doped region, 23, in the substrate, 21. In fabricating integrated circuit semiconductor devices, the substrate will conventionally have fabricated therein various active and passive devices which are not illustrated in FIGS. 3–5, since they do not constitute part of the invention. The devices may include metal oxide semiconductor field effect transistor, (MOSFET), devices of either NFET or PFET types and/or complimentary, CMOS, as well as BiCMOS devices. Conducting layer, 25, is formed over the dielectric layer, 22, and into the contact opening, 24. Conventional lithographic techniques are used to define the photoresist mask pattern, 26, on top of the conducting layer, 25.

Figure 4:
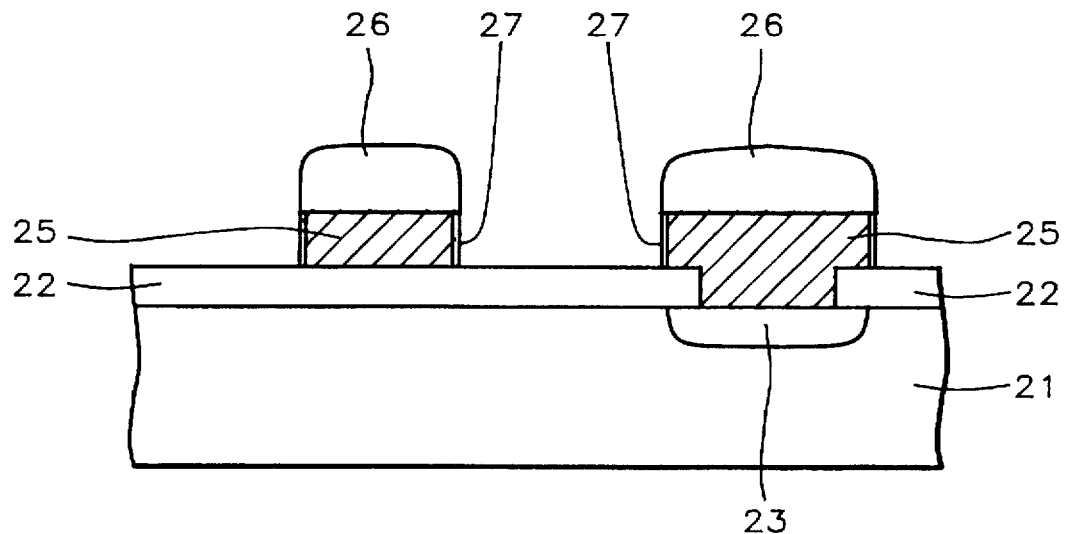
FIG. 4, which schematically, in cross-sectional representation, illustrates an etched pattern in a conducting layer, prior to stripping the photoresist mask.

The substrate is then loaded into an in-line etch tool such as a LAM Research TCP9600 and the conducting layer, 25, is etched in a plasma containing $Cl_2$ and $BCl_3$, as shown schematically in cross-sectional representation in FIG. 4. During this etch step the unmasked regions of the conducting layer, 25, are removed and thin sidewall layers, 27, containing redeposited photoresist and chlorine containing substances, are deposited onto the etched pattern in layer, 25.

Figure 5:
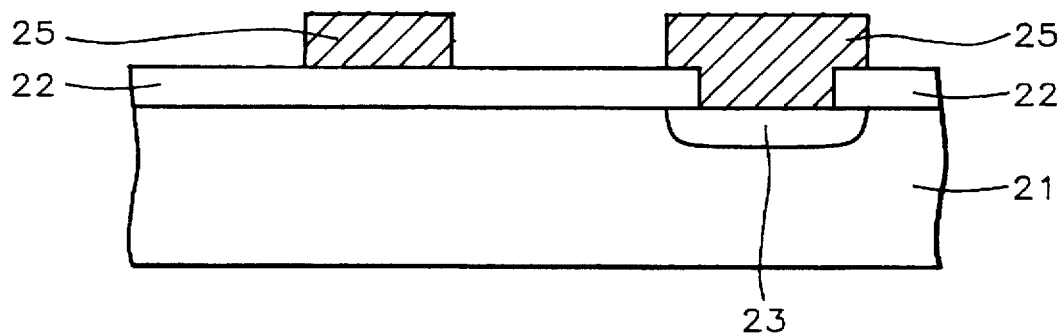
FIG. 5, which schematically, in cross-sectional representation, illustrates an etched pattern in a conducting layer, after stripping the photoresist mask.

The substrate is then transferred to a second chamber, which is heated in the range between about 200° to 300° C., for removal of the remaining photoresist mask. The photoresist etch process is a two-step process in which the first step etches the photoresist mask in an $H_2O/O_2$ plasma containing $O_2$ at a flow between about 200 to 400 sccm and $H_2O$ at a flow between about 200 to 400 sccm, at a total pressure between about 1000 to 1600 mTorr, and at an RF power between about 850 to 1450 Watts. The second step etches the photoresist mask in a plasma containing $O_2$ at a flow between about 500 to 1000 sccm, at a pressure between about 1000 to 1600 mTorr, and at an RF power between about 850 to 1450 Watts. The benefits of the two-step photoresist etch process are to use an $H_2O/O_2$ plasma, Step 19, to effectively remove the chlorine and chlorine compounds and chlorine bearing reaction products, which are embedded into the photoresist mask on top of the etched metal pattern and attached to the sidewalls of the etched pattern, following the conductor layer $Cl_2/BCl_3$ etch process; and then to use an $O_2$ plasma, Step 20, to etch photoresist at an accelerated rate, thereby requiring less time and/or lower RF power, to completely remove residual photoresist. FIG. 5, schematically in cross-sectional representation, shows an etched pattern in conducting layer, 25, after removal of the photoresist mask.

Referring again to FIG. 2, in the preferred embodiment, the duration of time for the second photoresist etch process, Step 20, is longer than the duration of time for the first photoresist etch process, Step 19. The preferred duration of time for the second photoresist etch process, Step 20, is between about 50 to 100 sec. For maximum efficiency in the preferred in-line etch tool, the total time permitted for etching the photoresist is between about 90 to 180 sec.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a conductive interconnection layer in an integrated circuit comprising:

loading a wafer cassette, containing substrates having a photoresist mask pattern formed over a conductive material layer, to a plasma etcher apparatus;

etching said conducting material layer by vertical anisotropic etching;

transferring said substrate to a second heated chamber;

first stripping said photoresist mask in said second heated chamber, in a first plasma containing $O_2$ and $H_2O$; and second stripping said photoresist mask in said second heated chamber, in a second plasma containing $O_2$.

2. The method of claim 1, wherein said conductive material layer is Ti/TiW/Al-Cu-Si/TiN.

3. The method of claim 1, wherein said conductive material layer is Ti/TiN/Al-Cu-Si/TiN.

4. The method of claim 1, wherein said conductive material layer is Ti/Al-Cu-Si/TiN.

5. The method of claim 1, wherein said conductive material layer is Ti/Al-Cu/TiN.

6. The method of claim 1, wherein said conductive material layer is Ti/TiW/Al-Cu/TiN.

7. The method of claim 1, wherein said conductive material layer is Ti/TiN/Al-Cu/TiN.

8. The method of claim 1, wherein said vertical anisotropic etching is performed in a plasma containing $Cl_2$ and $BCl_3$ for etching TiN and aluminum alloys, and $SF_6$ and $BCl_3$ for etching TiW and Ti.

9. The method of claim 1, wherein said vertical anisotropic etching is performed in a plasma containing $Cl_2$ and $BCl_3$ for etching TiN and aluminum alloys, and $CF_4$ and $BCl_3$ for etching TiW and Ti.

10. The method of claim 1, wherein said second heated chamber is controlled in the temperature range between about 200° to 300° C.

11. The method of claim 1, wherein said first stripping and said second stripping of said photoresist mask are performed in a single wafer etch chamber.

12. The method of claim 11, wherein said single wafer etch chamber is heated in the temperature range between about 200° to 300° C.

13. The method of claim 11, wherein said first stripping of said photoresist mask is in a plasma containing $O_2$ at a flow between about 200 to 400 sccm and $H_2O$ at a flow between about 200 to 400 sccm, at a total pressure between about 1000 to 1600 mTorr, and at an RF power between about 850 to 1450 Watts.

14. The method of claim 11, wherein said second stripping of said photoresist mask is in a plasma containing $O_2$ at a flow between about 500 to 1000 sccm, at a pressure between about 1000 to 1600 mTorr, and at an RF power between about 850 to 1450 Watts.

15. The method of claim 11, wherein the duration of time for said second stripping of said photoresist is longer than the duration of time for said first stripping of said photoresist.

16. The method of claim 15, wherein the duration of time for said second stripping of said photoresist is between about 50 to 100 sec.

17. The method of claim 11, wherein the duration of time for said second stripping of said photoresist is longer than the duration of time for said first stripping of said photoresist, and the total time for said first and second strippings of photoresist is between about 80 to 180 sec.

18. The method of claim 17, wherein said duration of time for said second stripping of said photoresist is between about 50 to 100 sec., and the total time for said first and second strippings of photoresist is between about 90 to 180 sec.

19. A method of fabrication of an aluminum containing interconnection layer in an integrated circuit comprising:

loading wafer cassette, containing substrates having a photoresist mask pattern formed over a Ti/TiW/Al-Cu-Si/TiN layer, to a single wafer plasma etcher apparatus;

etching said Ti/TiW/Al-Cu-Si/TiN layer by vertical anisotropic etching;

transferring said substrates to a second heated single wafer etch chamber;

first stripping said photoresist mask in said second heated single wafer chamber, in a first plasma containing $O_2$ and $H_2O$; and second stripping said photoresist mask in said second heated single wafer chamber, in a second plasma containing $O_2$.

20. The method of claim 19, wherein said second heated single wafer etch chamber is heated in the temperature range between about 200° to 300° C.

21. The method of claim 19, wherein said first stripping of said photoresist mask is in a plasma containing $O_2$ at a flow between about 200 to 400 sccm and $H_2O$ at a flow between about 200 to 400 sccm, at a total pressure between about 1000 to 1600 mTorr, and at an RF power between about 850 to 1450 Watts.

22. The method of claim 19, wherein said second stripping of said photoresist mask is in a plasma containing $O_2$ at a flow between about 500 to 1000 sccm, at a pressure between about 1000 to 1600 mTorr, and at an RF power between about 850 to 1450 Watts.

23. The method of claim 19, wherein the duration of time for said second stripping of said photoresist is longer than the duration of time for said first stripping of said photoresist.

24. The method of claim 23, wherein the duration of time for said second stripping of said photoresist is between about 50 to 100 sec.

25. The method of claim 19, wherein the duration of time for said second stripping of said photoresist is longer than the duration of time for said first stripping of said photoresist, and the total time for said first and second strippings of photoresist is between about 90 to 180 sec.

26. The method of claim 25, wherein said duration of time for said second stripping of said photoresist is between about 50 to 100 sec., and the total time for said first and second strippings of photoresist is between about 90 to 180 sec.

27. A method of fabrication of an aluminum containing interconnection layer in an integrated circuit comprising:

loading wafer cassette, containing substrates having a photoresist mask pattern formed over a Ti/TiN/Al-Cu-Si/TiN layer, to a single wafer plasma etcher apparatus;

etching said Ti/TiN/Al-Cu-Si/TiN layer by vertical anisotropic etching in a plasma containing $Cl_2$ and $BCl_3$;

transferring said substrate to a second heated single wafer etch chamber;

first stripping said photoresist mask in said second heated single wafer chamber, in a first plasma containing $O_2$ and $H_2O$; and second stripping said photoresist mask in said second heated single wafer chamber, in a second plasma containing $O_2$.

28. The method of claim 27, wherein said second heated single wafer etch chamber is heated in the temperature range between about 200° to 300° C.

29. The method of claim 27, wherein said first stripping of said photoresist mask is in a plasma containing $O_2$ at a flow between about 200 to 400 sccm and $H_2O$ at a flow between about 200 to 400 sccm, at a total pressure between about 1000 to 1600 mTorr, and at an RF power between about 850 to 1450 Watts.

30. The method of claim 27, wherein said second stripping of said photoresist mask is in a plasma containing $O_2$ at a flow between about 500 to 1000 sccm, at a pressure between about 1000 to 1600 mTorr, and at an RF power between about 850 to 1450 Watts.

31. The method of claim 27, wherein the duration of time for said second stripping of said photoresist is longer than the duration of time for said first stripping of said photoresist.

32. The method of claim 31, wherein the duration of time for said second stripping of said photoresist is between about 50 to 100 sec.

33. The method of claim 27, wherein the duration of time for said second stripping of said photoresist is longer than the duration of time for said first stripping of said photoresist, and the total time for said first and second strippings of photoresist is between about 90 to 180 sec.

34. The method of claim 33, wherein said duration of time for said second stripping of said photoresist is between about 50 to 100 sec., and the total time for said first and second strippings of photoresist is between about 90 to 180 sec.

35. A method of fabrication of an aluminum containing interconnection layer in an integrated circuit comprising:

loading wafer cassette, containing substrates having a photoresist mask pattern formed over a Ti/Al-Cu-Si/TiN layer, to a single wafer plasma etcher apparatus;

etching said Ti/Al-Cu-Si/TiN layer by vertical anisotropic etching in a plasma containing $Cl_2$ and $BCl_3$;

transferring said substrate to a second heated single wafer etch chamber;

first stripping said photoresist mask in said second heated single wafer chamber, in a first plasma containing $O_2$ and $H_2O$; and second stripping said photoresist mask in said second heated single wafer chamber, in a second plasma containing $O_2$.

36. The method of claim 35, wherein said second heated single wafer etch chamber is heated in the temperature range between about 200° to 300° C.

37. The method of claim 35, wherein said first stripping of said photoresist mask is in a plasma containing $O_2$ at a flow between about 200 to 400 sccm and $H_2O$ at a flow between about 200 to 400 sccm, at a total pressure between about 1000 to 1600 mTorr, and at an RF power between about 850 to 1450 Watts.

38. The method of claim 35, wherein said second stripping of said photoresist mask is in a plasma containing $O_2$ at a flow between about 500 to 1000 sccm, at a pressure between about 1000 to 1600 mTorr, and at an RF power between about 850 to 1450 Watts.

39. The method of claim 35, wherein the duration of time for said second stripping of said photoresist is longer than the duration of time for said first stripping of said photoresist.

40. The method of claim 39, wherein the duration of time for said second stripping of said photoresist is between about 50 to 100 sec.

41. The method of claim 35, wherein the duration of time for said second stripping of said photoresist is longer than the duration of time for said first stripping of said photoresist, and the total time for said first and second strippings of photoresist is between about 90 to 180 sec.

42. The method of claim 41, wherein said duration of time for said second stripping of said photoresist is between about 50 to 100 sec., and the total time for said first and second strippings of photoresist is between about 90 to 180 sec.

* * * * *

UNITED STATES PATENT AND TRADEMARK OFFICE
CERTIFICATE OF CORRECTION

PATENT NO. : 5,792,672
DATED : 8/11/98
INVENTOR(S) : Lap Chan, Simon Chooi Yew Meng, Tony Chan It is certified that error appears in the above-indentified patent and that said Letters Patent is hereby corrected as shown below:

On the Cover Page, at (75), delete "Simon Chooi Yen Meng" and replace with --Simon Chooi Yew Meng--.

Signed and Sealed this

Eighth Day of December, 1998

*Attest:*

BRUCE LEHMAN

*Attesting Officer*         *Commissioner of Patents and Trademarks*